US008669565B2

(12) United States Patent
Chan et al.

(10) Patent No.: US 8,669,565 B2
(45) Date of Patent: Mar. 11, 2014

(54) LED DEVICES WITH NARROW VIEWING ANGLE AND AN LED DISPLAY INCLUDING SAME

(75) Inventors: Chi Keung Chan, Sheung Shui (HK); Zhi Kuan Zhang, Shatin (HK); Xiang Fei, Huizhou (CN); Hao Liu, Huizhou (CN); Ju Zuo Sheng, Huizhou (CN); David Todd Emerson, Chapel Hill, NC (US)

(73) Assignee: Cree Huizhou Solid State Lighting Company Limited, Huizhou, Guangdong (CN)

( * ) Notice: Subject to any disclaimer, the term of this patent is extended or adjusted under 35 U.S.C. 154(b) by 0 days.

(21) Appl. No.: 13/161,245

(22) Filed: Jun. 15, 2011

(65) Prior Publication Data

US 2012/0120118 A1      May 17, 2012

Related U.S. Application Data

(63) Continuation of application No. PCT/CN2011/000648, filed on Apr. 13, 2011, and a continuation-in-part of application No. 12/868,567, filed on Aug. 25, 2010, which is a continuation-in-part of application No. 12/635,818, filed on Dec. 11, 2009, which is a continuation of application No. 11/739,307, filed on Apr. 24, 2007, now Pat. No. 7,649,209.

(60) Provisional application No. 60/745,478, filed on Apr. 24, 2006.

(51) Int. Cl.
*H01L 33/02*      (2010.01)

(52) U.S. Cl.
USPC ................ 257/79; 257/E33.045; 362/296.05; 345/690

(58) Field of Classification Search
USPC ........................ 257/91, 98, E33.067, E33.058
See application file for complete search history.

(56) References Cited

U.S. PATENT DOCUMENTS

| 2006/0050526 A1* | 3/2006 | Ikeda et al. | 362/555 |
| 2008/0258156 A1* | 10/2008 | Hata | 257/88 |
| 2009/0072251 A1* | 3/2009 | Chan et al. | 257/89 |

FOREIGN PATENT DOCUMENTS

| CN | 101701674 A | 5/2010 |
| JP | 6-177428 A | 6/1994 |
| JP | 10-107325 A | 4/1998 |
| JP | 2000-12894 A | 1/2000 |

OTHER PUBLICATIONS

PCT International Search Report and Written Opinion for PCT/CN2011/000648, mailing date Feb. 2, 2012.

* cited by examiner

*Primary Examiner* — Zandra Smith
*Assistant Examiner* — Paul Patton
(74) *Attorney, Agent, or Firm* — Brinks Gilson & Lione

(57) ABSTRACT

LED devices includes a lead frame having a reflector cup with a round bottom surface and a wall surface having a variable inclination with respect to the bottom surface and defining an opening at an upper end thereof. An LED is mounted on the bottom surface of the reflector cup, and an LED module includes first and second LED device that emit different colors. The first and second LED devices have substantially matched far field patterns in a first and second direction, where a first viewing angle in the first direction is less than about 99°.

46 Claims, 13 Drawing Sheets

LED DEVICES WITH NARROW VIEWING ANGLE AND AN LED DISPLAY INCLUDING SAME

RELATED APPLICATIONS

This application is a continuation of International Application No. PCT/CN2011/000648, filed Apr. 13, 2011, and is a continuation-in-part of pending U.S. application Ser. No. 12/868,567, filed Aug. 25, 2010, which is a continuation-in-part of pending U.S. application Ser. No. 12/635,818, filed Dec. 11, 2009, which is a continuation of U.S. application Ser. No. 11/739,307, filed Apr. 24, 2007 (now U.S. Pat. No. 7,649,209), which claims the benefit of U.S. Provisional Application No. 60/745,478, filed Apr. 24, 2006. All of the aforementioned applications are incorporated herein by reference in their entirety.

FIELD OF THE DISCLOSURE

The disclosure relates, generally, to light emitting diodes (LEDs) and, more particularly, to LED devices with narrow viewing angles and to LED displays including such devices.

BACKGROUND

In recent years, there have been dramatic improvements in LED technology such that LEDs of increased luminance and color fidelity have been introduced. Due to these improved LEDs and improved image processing technology, large format, full color LED video screens have become available and are now in common use. LED displays typically comprise a combination of individual LED panels providing image resolutions determined by the distance between adjacent pixels or "pixel pitch."

Outdoor displays, which are intended for viewing from greater distances, have relatively large pixel pitches and usually comprise discrete LED arrays. In the discrete LED arrays, a cluster of individually mounted red, green, and blue LEDs are driven to form what appears to the viewer as a full color pixel. On the other hand, indoor screens, which require shorter pixel pitches such as 3 mm or less, typically comprise panels carrying red, green, and blue LEDs mounted on a single electronic device attached to a driver printed circuit board (PCB) that controls the output of each electronic device.

Although both indoor and outdoor displays are viewable across a substantial range of off-axis angles, there is often a perceptible loss of color fidelity with increasing viewing angle. Additionally, the material of each LED device and/or the material used to mount each of the LEDs may have reflective characteristics, which can further decrease color fidelity by creating unwanted light reflection and/or glare.

Usually, LED displays prefer a relatively wide viewing angle so that viewers may be able to view the displayed images and videos at different angles. However, there are certain situations a narrow viewing angle is preferred. For example, when high beam intensity is preferred, LED devices with a relatively narrow viewing angle is preferred. Also, for security and privacy concerns, a user of an LED display may prefer that others around him cannot see what is displayed on his or her LED display in public places. Further, such an LED display for personal use may consume less energy compared with wide viewing angle display.

SUMMARY

One objective of this disclosure is to create LED devices with narrow viewing angles and uniform far field pattern. The disclosed LED device may be used in LED displays for high quality and high performance video screens.

One embodiment of the LED device includes a lead frame having a reflector cup therein. The reflector cup has a round bottom surface and a wall surface having a variable inclination with respect to the bottom surface and defining an opening at an upper end thereof. There is an LED mounted on the bottom surface. The reflector cup has a depth from the upper end of the wall surface to the bottom surface larger than about 0.25 mm.

Another embodiment discloses a display that includes a substrate carrying an array of light emitting diode (LED) devices arranged in vertical columns and horizontal rows. At least one of the LED devices including a lead frame has a reflector cup. The reflector cup has a round bottom surface and a wall surface having a variable inclination with respect to the bottom surface and defining an opening at an upper end thereof. An LED is mounted on the bottom surface of the reflector cup. The reflector cup has a depth from the upper end of the wall surface to the bottom surface larger than about 0.25 mm. The display further includes signal processing and LED drive circuitry electrically connected to selectively energize the array of LED devices for producing visual images on the display.

Yet another embodiment discloses a lead frame including a reflector cup having a round bottom surface and a wall surface having a variable inclination with respect to the bottom surface and defining an opening at an upper end thereof. The reflector cup has a depth from the upper end of the wall surface to the bottom surface larger than about 0.25 mm.

A forth embodiment discloses an LED device including a reflector cup having a round bottom surface and wall surface. The wall surface has a vertical portion relative to the bottom surface and joined to the bottom surface. The vertical portion separates the bottom surface from an inclined portion that defines an opening at an upper end of the reflector cup. There is an LED mounted on the bottom surface.

A fifth embodiment discloses an LED module including a first and second LED device that emits different colors. The first and second LED device has matched far field pattern in a first and second direction. A first viewing angle in the first direction is less than about 99°, and a second viewing angle in the second direction is less than about 50°.

A sixth embodiment discloses a display including a substrate carrying an array of LED modules arranged in vertical columns and horizontal rows. The LED display generates a luminance at least about 5000 nit. Each LED module includes a first and a second LED device that emit different colors. The first and second LED devices have substantially matched far field patterns in a first and a second direction. A first viewing angle in the first direction is less than about 99°, and a second viewing angle in the second direction is less than about 50°. The LED display also includes signal processing and LED drive circuitry electrically connected to selectively energize the array of LED modules devices for producing visual images on the display.

A seventh embodiment discloses a display including a substrate carrying an array of LED modules arranged in vertical columns and horizontal rows. A pitch between adjacent LED modules is less than about 44 mm. The LED display generates a luminance at about 5000 nit to about 24000 nit. Each LED module includes a first and a second LED device that emit different colors. The first and second LED devices have substantially matched far field patterns in a first and a second direction. A first viewing angle in the first direction is less than about 99°, and a second viewing angle in the second direction is less than about 50°. The LED display also includes signal processing and LED drive circuitry electrically connected to selectively energize the array of LED modules devices for producing visual images on the display.

An eighth embodiment discloses a display including a substrate carrying an array of LED modules arranged in vertical columns and horizontal rows. A pitch between adjacent LED modules is about 20 mm. The display also includes signal processing and LED drive circuitry electrically connected to selectively energize the array of LED modules for producing visual images on the display. Each LED module includes a first LED that emits green light, a second LED device that emits blue light, and a third LED that emits red light, wherein the display has a luminance of about 5000 nit. The first and second LED devices have substantially matched far field patterns in a first and a second direction, and a first viewing angle in the first direction of less than about 99°, and a second viewing angle in the second direction of less than about 50°. The working current of the first LED is less than about 4.1 mA, the working current of the second LED is less than about 2.7 mA, and the working current of the third LED is less than about 3.1 mA. A voltage supply of the first LED is less than about 2.6V, a voltage supply of the second LED is less than about 2.44V, and a voltage supply of the third LED is less than about 1.81V. A lamp power efficiency is about 161 lm/W for first LED device, about 33 lm/W for the second LED device, and about 152 lm/W for the first LED device. The display consumes less than about 14.0 W per m2 when generating red light, the display consumes less than about 26.6 W per m$^2$ when generating green light, the display consumes less than about 16.8 W per m$^2$ when generating blue light, the display consumes less than about 57.4 W per m$^2$ when generating white light. The display saves about 40% or more power compared to other displays using normal LED devices.

A ninth embodiment discloses an LED device configured to produce a first viewing angle in a first direction of less than about 99° and a second viewing angle in a second direction of less than about 50°.

A tenth embodiment discloses an LED device includes a lead frame having a reflector cup therein. The reflector cup has a round bottom surface and a wall surface having a variable inclination with respect to the bottom surface and defining an opening at an upper end thereof. There is an LED mounted at the center of the round bottom surface. The LED device has a first viewing angle in a first direction of less than about 99° and a second viewing angle in a second direction of less than about a half of the first viewing angle.

An eleventh embodiment discloses an LED device configured to produce a first viewing angle in a first direction and a second viewing angle in a second direction. The first and second viewing angles are less than about 50°. The first direction is orthogonal to the second direction.

A twelfth embodiment discloses a display including an array of pixels. Each pixel has at least one light emitting diode (LED) devices including a lead frame having a reflector cup. The reflector cup has a round bottom surface and a wall surface having a variable inclination with respect to the bottom surface and defining an opening at an upper end thereof. There is an LED mounted on the round bottom surface. The display also includes signal processing and LED drive circuitry electrically connected to selectively energize the array of LED devices for producing visual images on the display. The reflector cup has a depth from the upper end of the wall surface to the bottom surface larger than about 0.25 mm. A pixel pitch between adjacent pixels is less than about 44 mm.

A thirteenth embodiment discloses a LED display configured to produce a 2D far field pattern that has an elliptical shape, wherein the elliptical shape at a distance of about 50 m from the display has a first dimension in a first direction of less than about 143 m and a second dimension in a second direction of less than about 58 m, where the first direction is orthogonal to the second direction.

A fourteenth embodiment discloses an LED display configured to produce a 2D far field pattern that has an elliptical shape, wherein the elliptical shape at a distance of about 50 m from the display has a horizontal dimension in a first direction of less than about 143 m.

DETAILED DESCRIPTION

Figure 1:
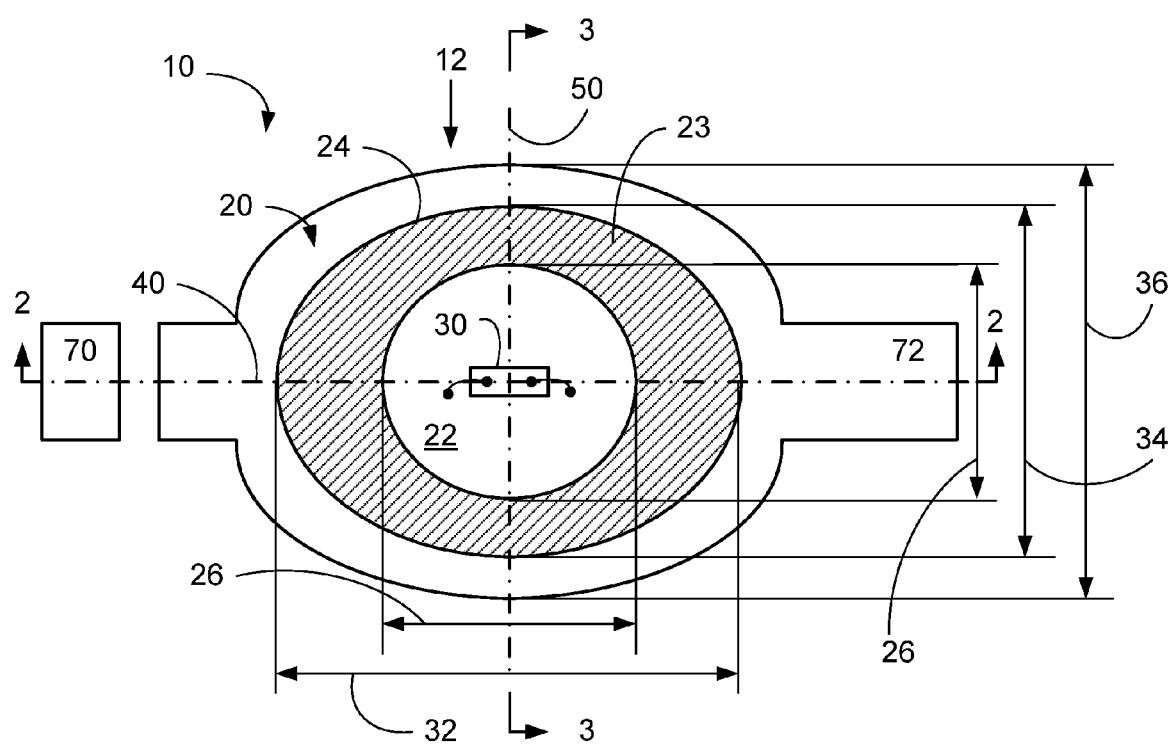
FIG. 1 is a top view of an LED device according to an embodiment of the present disclosure.

The following description presents preferred embodiments of the disclosure representing the best mode contemplated for practicing the disclosure. This description is not to be taken in a limiting sense but is made merely for the purpose of describing the general principles of the disclosure, the scope of which is defined by the appended claims.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

The far field pattern (FFP) is an optical characteristic of LED devices that represents LED the luminous intensity of the LED device in space. Usually, FFP illustrates a normalized luminous intensity ratio at different radiation angles. As used herein, the viewing angle is the angular extent to which the intensity of light emitted from the LED device is at least about 50% of the intensity peak in a FFP.

Figure 2:
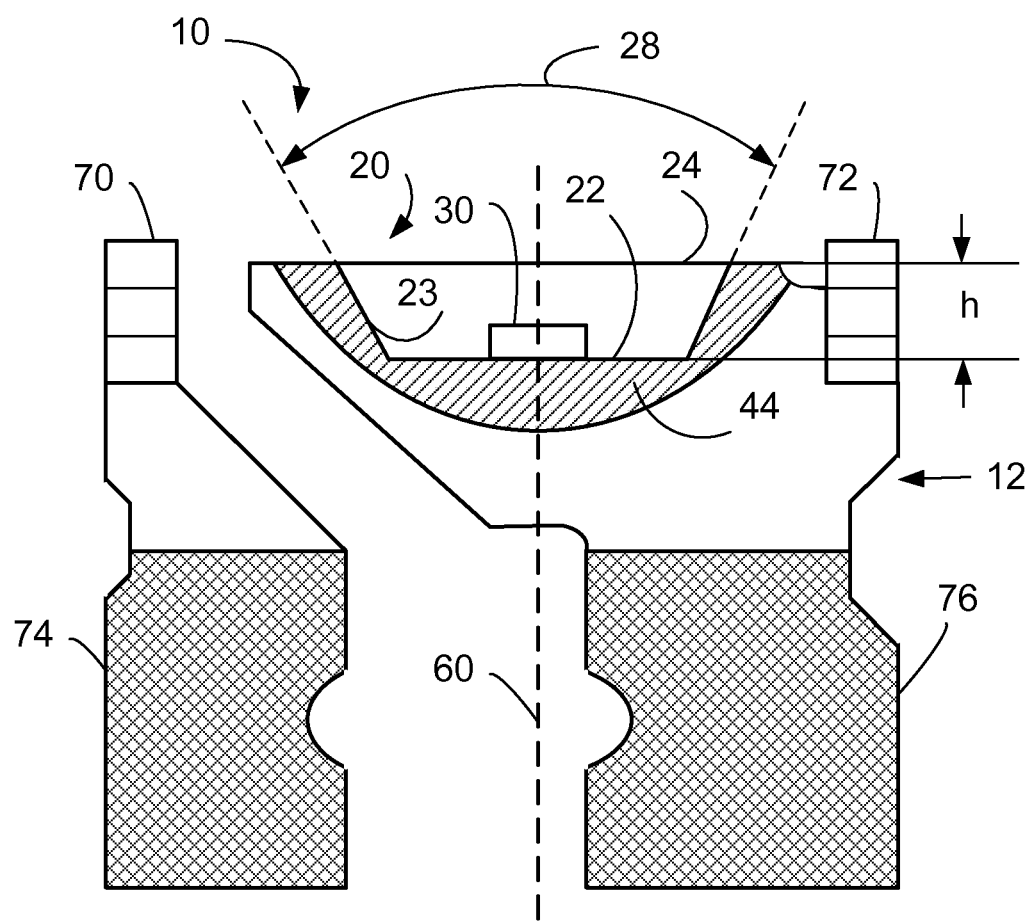
FIG. 2 is a cross-sectional view of the embodiment illustrated in FIG. 1, taken along section line 2-2.
Figure 3:
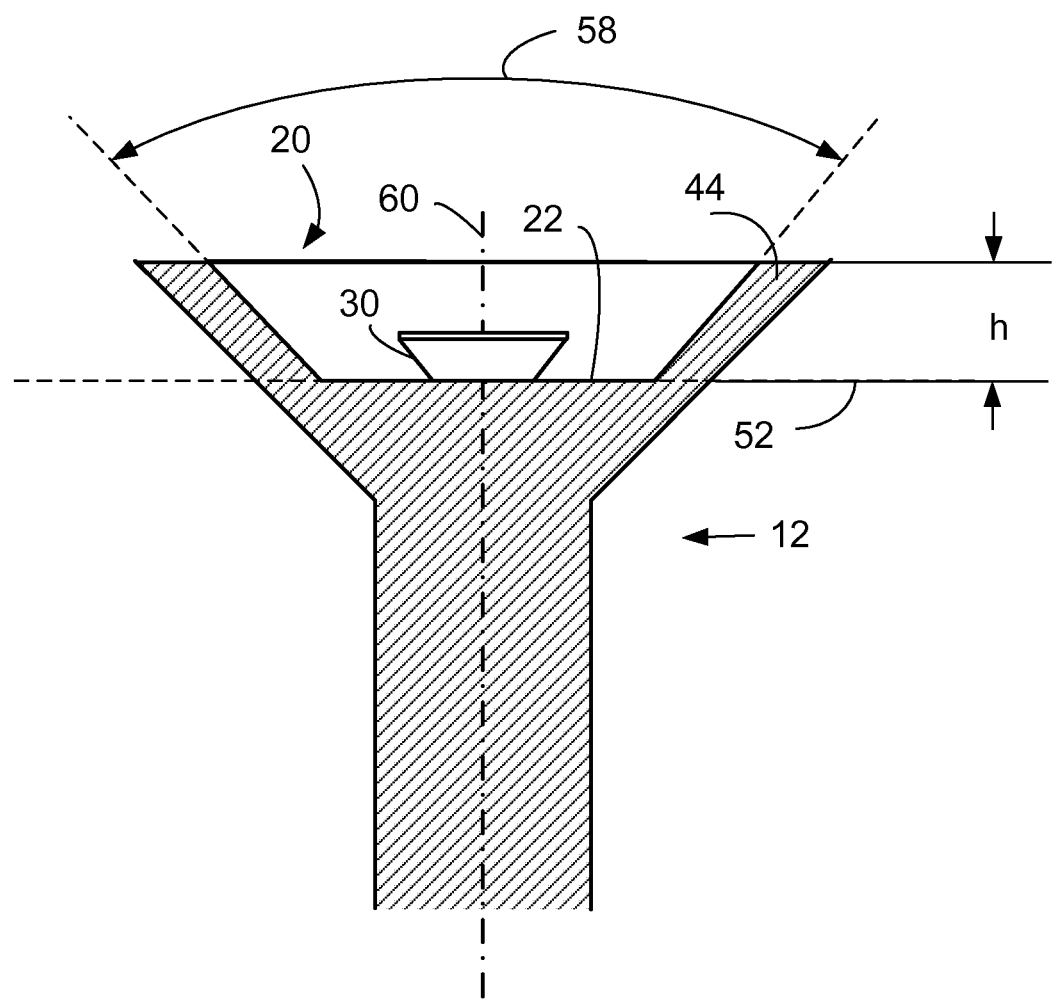
FIG. 3 illustrates a side partial cutaway profile view of the embodiment in FIG. 1, taken along view lines 3-3.

FIGS. 1-3 depict an embodiment of an LED device 10 in different views. FIG. 1 is a top view of LED device 10. LED device 10 includes a lead frame 12 having reflector cup 20. Reflector cup 20 has a round bottom surface 22 and a wall surface 23 inclined relative to bottom surface 22, the wall surface defining an opening 24 at an upper end of reflector cup 20. In accordance with an embodiment of the disclosure, the inclination angle between wall surface 23 and bottom surface 22 varies at different points around the perimeter of bottom surface 22.

In some embodiments, bottom surface 22 has a diameter 26 that is about 0.50 mm to about 0.70 mm, more preferably about 0.58 mm to about 0.62 mm and, most preferably, about 0.60 mm. In other embodiments, bottom surface 22 has a diameter 26 that is less than about 0.70 mm, more preferably less than about 0.65 mm and, most preferably, less than about 0.60 mm. An LED 30 is mounted in a central location on bottom surface 22. There are two topside wirebonds on the upper surface of LED 30 connected to two wires to the bottom surface 22. LED 30 may have other configurations, such as chips with no wirebonds or vertical chip with one wirebond. LED 30 may also be flipped or rotated for desired far field pattern.

Opening 24 has a first axial dimension 32 along a first axis 40 and a second axial dimension 34 along a second axis 50, orthogonal to first axis 40. In some embodiments, preferably, first axial dimension 32 is about 0.8 mm to about 0.9 mm and second axial dimension 34 is about 0.7 mm to about 0.8 mm. More preferably, first axial dimension 32 is about 0.82 mm to about 0.88 mm, and second axial dimension 34 is about 0.72 mm to about 0.78 mm. Most preferably, first axial dimension 32 is about 0.86 mm, and second axial dimension 34 is about 0.75 mm. In some embodiments, preferably, first axial dimension 32 is less than about 0.9 mm and second axial dimension 34 is less than about 0.8 mm. More preferably, first axial dimension 32 is less than about 0.85 mm, and second axial dimension 34 is less than 0.75 mm. Most preferably, first axial dimension 32 is less than about 0.8 mm, and second axial dimension 34 is less than about 0.7 mm.

In this embodiment, the horizontal viewing angle along first axis 40 is larger than the viewing angle along the second axis 50. LED 30 may emit red, green, or blue light. Preferably, LED 30 emits green or blue light. LED device 10 may further include bond pad areas 70 and 72 for wire bonding LED 30 to lead frame 12.

FIG. 2 is a cross-sectional view of the embodiment in FIG. 1, taken along section line 2-2. Reflector cup 20 has a depth "h" larger than about 0.25 mm from upper end of wall surface 23 to bottom surface 22. When LED 30 emits green or blue light depth h is preferably about 0.25 mm to about 0.40 mm, more preferably about 0.28 mm to about 0.36 mm, and most preferably about 0.28 mm. Bond pad 70 is conductively connected with lead 74 and bond pad 72 is connected with lead 76. The reflector cup 20 has a wall 44 that is formed when reflector cup 20 is stamped into lead 76, for example by operation of a stamping machine. Wall 44 may have a non-uniform thickness in lead 76. The composition of lead frame 12 including wall 44 and leads 70 and 72 may be a material such as copper, iron, or other suitable conductive material that can also dissipate heat. In a preferred embodiment, lead frame 12 is comprised of iron.

FIG. 3 illustrates a partial cut-away side view of LED device 10. Referring to FIGS. 1-3, reflector cup 20 has a round bottom surface 22 and a wall surface 23 inclined with respect to bottom surface 22. The degree of inclination of wall surface 23 relative to bottom surface 22 continually varies about the perimeter of bottom surface 22, such that a first opening angle 28 in FIG. 2 is different from a second opening angle 58 in FIG. 3. In one aspect of the disclosed embodiment of LED device 10, first opening angle 28, in combination with additional design features, may substantially establish the horizontal viewing angles of LED device 10. Correspondingly, second opening angle 58 may substantially establish the vertical viewing angles of LED device 10. In one embodiment, first opening angle 28 may be less than second opening angle 58, so that, for example, the horizontal viewing angle of LED device 10 is larger than the vertical viewing angle.

Preferably, a first opening angle 28 of reflector cup 20, as seen in FIG. 2, is less than about 55°, more preferably, less than about 53° and, most preferably less than about 50°. Correspondingly, second opening angle 58 is preferably less than about 35°, more preferably less than about 33° and, most preferably less than about 30°. In another embodiment, first opening angle 28 is about 45° to about 55°, more preferably, about 47° to about 53° and, most preferably about 50°. Correspondingly, second opening angle 58 is about 25° to about 35°, more preferably about 27° to about 33° and, most preferably about 30°.

Figure 4:
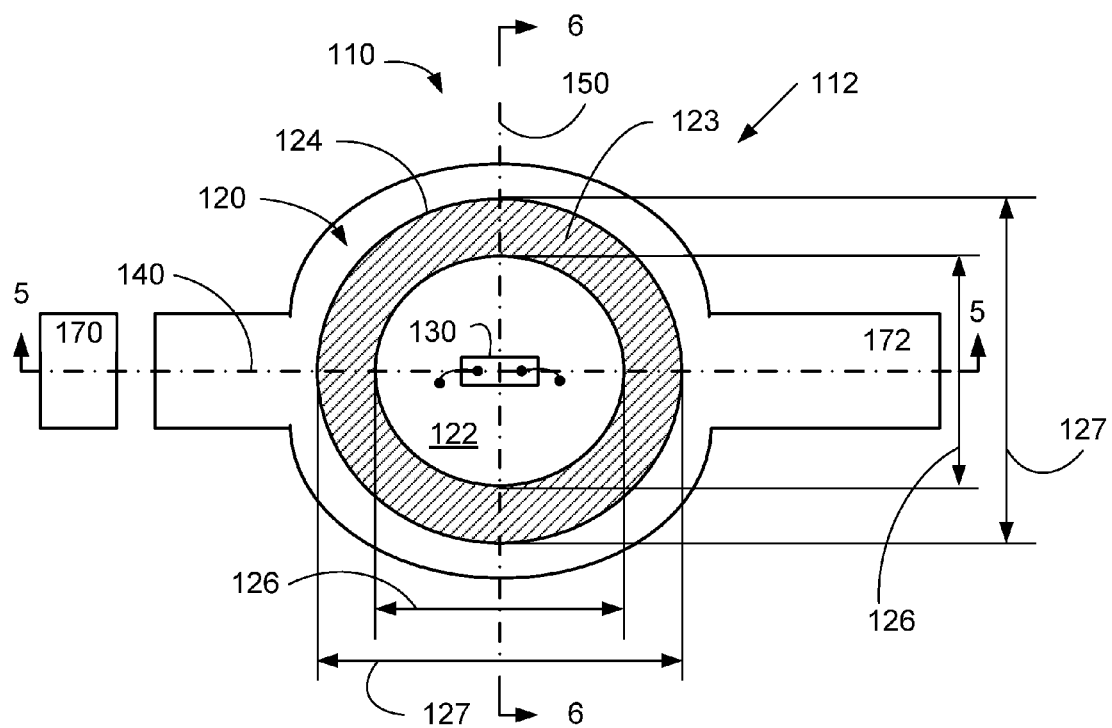
FIG. 4 is a top view of an LED device according to another embodiment of the disclosure.
Figure 5:
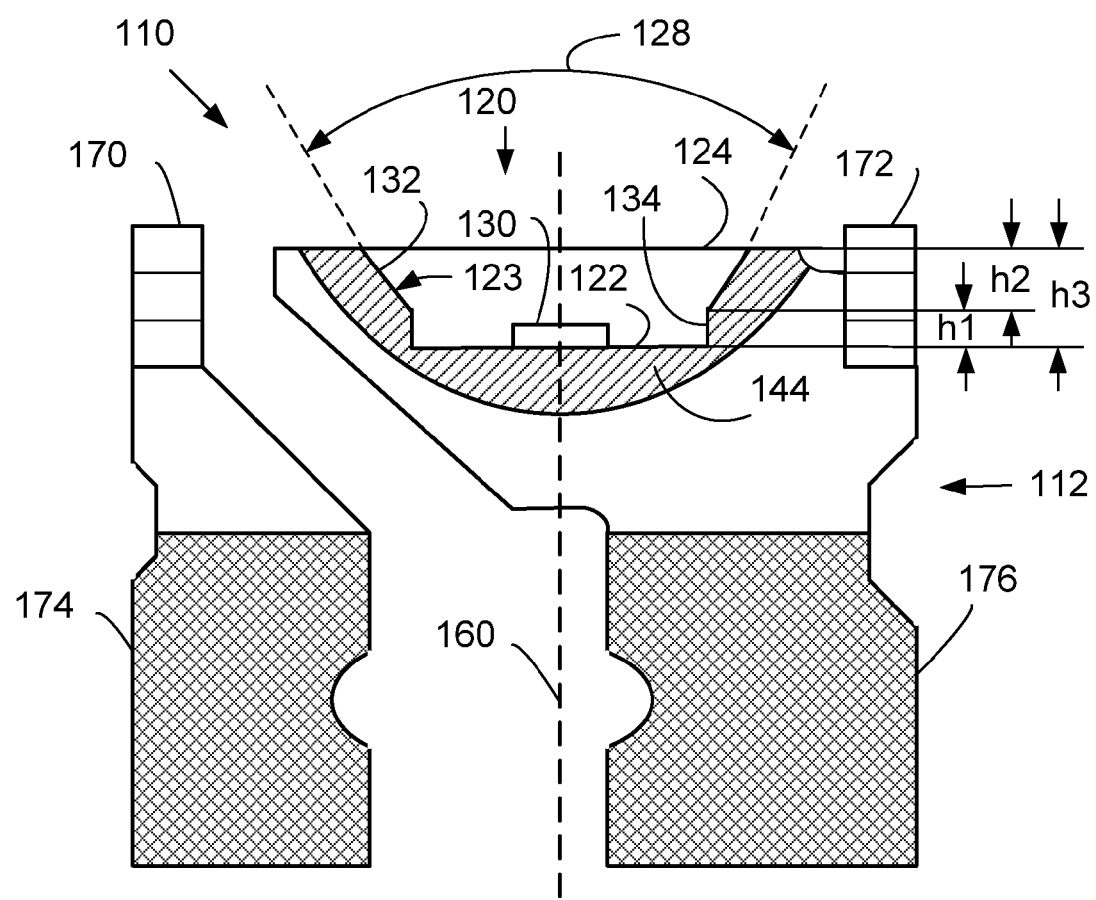
FIG. 5 is a cross-sectional view of the embodiment illustrated in FIG. 4, taken along section line 5-5.
Figure 6:
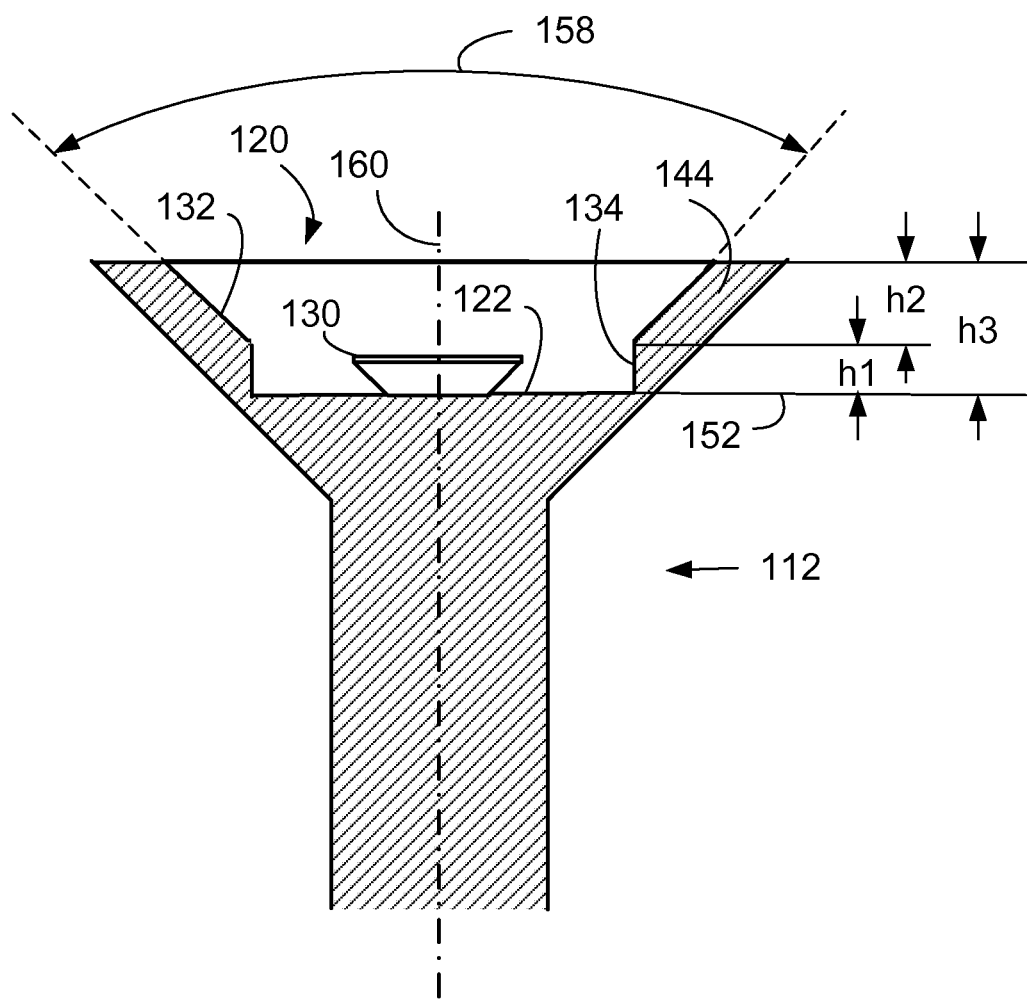
FIG. 6 illustrates a side partial cutaway profile view of the embodiment in FIG. 4, taken along view lines 6-6.

FIGS. 4-6 illustrate another embodiment of an LED device 110 in accordance with the disclosure. FIG. 4 is a top view of LED device 110. FIG. 5 is a cross-sectional view of LED device 110 in FIG. 4, taken along section line 5-5. FIG. 6 illustrates a side partial cutaway profile view of LED device 110 in FIG. 4, taken along view lines 6-6.

LED device 110 includes a lead frame 112 having a reflector cup 112. Reflector cup 112 has a round bottom surface 122 and a wall surface 123. Wall surface 123 has an inclined portion 132 and a vertical portion 134 relative to bottom surface 122 and joined to bottom surface 122. Vertical portion 134 separates bottom surface 122 from inclined portion 132. Inclined portion 132 defines an opening 124 at an upper end of reflector cup 120. An LED 130 is mounted in a central portion of bottom surface 122. There are two topside wirebonds on the upper surface of LED 130 connected to two wires to round bottom surface 122. LED 130 may have other configurations, such as chips with no wirebonds or vertical chip with one wirebond. LED 130 may also be flipped or rotated for desired far field pattern.

In some embodiments, bottom surface 122 has a diameter 126 of preferably, about 0.50 mm to about 0.70 mm, more preferably about 0.58 mm to about 0.62 mm and, most preferably, about 0.60 mm. In other embodiments, bottom surface 122 has a diameter 126 that is less than about 0.70 mm, more preferably less than about 0.65 mm and, most preferably, less than about 0.60 mm. In some embodiments, opening 124 has a diameter 127 of preferably, less than about 1.1 mm, more preferably, less than about 1.05 mm and, most preferably, less than about 1.0 mm. In other embodiments, opening 124 has a diameter 127 of preferably, about 0.9 mm to about 1.1 mm, more preferably about 0.95 mm to about 1.05 mm and, most preferably, about 1.0 mm. In similarity to the earlier embodiment, lead frame 112 including wall 144 and leads 170 and 172 may be composed of copper, iron, or other suitable conductive material that can also dissipate heat. In one embodiment, lead frame 112 is composed of iron.

Vertical portion 134 of wall surface 123 has a height "h1," and inclined portion 132 has a height "h2." Wall surface 123 has a total height h3=h1+h2, which corresponds to the depth of reflector cup 120. Height h1 may be slightly larger than the profile height of LED 130. Further, height h2 may be larger than height h1. In some embodiments, h3 is larger than about 0.25 mm. Preferably, height h3 is about 0.25 mm to about 0.40 mm, more preferably, about 0.32 mm to about 0.38 mm and, most preferably, about 0.35 mm.

Reflector cup 120 has a first opening angle 128 illustrated in FIG. 5 and a second opening angle 158 illustrated in FIG. 6. In one embodiment, first opening angle 128 is similar to second opening angle 158. Preferably, first opening angle 128 and second opening angle 158 are about 50° to about 70°, more preferably, about 55° to about 65° and, most preferably about 60°.

LED 130 may emit red, green, or blue light. For example, LED 130 emits red light. In one embodiment, LED 130 has a horizontal viewing angle which is larger than a vertical viewing angle. The horizontal and vertical viewing angles of LED device 110 may be less than the horizontal and vertical viewing angles of LED device 10, respectively. For example, viewing angles of LED device 110 is less than about 1° to 3° of the horizontal and vertical viewing angles of LED device 10, respectively.

Those skilled in the art will recognize the performance of the LED devices disclosed herein will vary depending upon the particular design parameters disclosed above and the wavelength of light emitted by the LEDs housed within the disclosed LED devices. In some embodiments, LED device 10 and 110 may generate a peak luminous intensity (Iv) of ranging from about 1205 mcd to about 6100 mcd at a working current less than about 20 mA.

Where LEDs 30 and 130 emit green light, for example, LED devices 10 and 110 can generate a peak luminous intensity of at least about 5600 mcd, more preferably at least about 6000 mcd, and most preferably at least about 6300 mcd. In another example, LED devices 10 and 110 can generate a peak luminous intensity of about 5600 mcd to about 6100 mcd, more preferably about 5800 mcd to about 5900 mcd, and most preferably about 5820 mcd to about 5880 mcd. In a particularly preferred embodiment, LEDs 30 and 130 generate a peak luminous intensity of about 5850 mcd at a wavelength of about 520 nm to about 535 nm and centered at about 527 nm.

Correspondingly, where LEDs 30 and 130 emit blue light, for example, LED devices 10 and 110 can generate a peak luminous intensity of at least about 1205 mcd, more preferably at least about 1605 mcd, and most preferably at least about 1905 mcd. In another example, LED devices 10 and 110 can generate a peak luminous intensity of about 1205 mcd to about 1705 mcd, more preferably, about 1405 mcd to about 1505 mcd, and most preferably, about 1425 mcd to about 1485 mcd. In a particularly preferred embodiment, LEDs 30 and 130 generate a peak luminous intensity of about 1455 mcd at a wavelength of about 460 nm to about 475 nm and centered at about 470 nm.

Where LEDs 30 and 130 emit red light, for example, LED devices 10 and 110 can generate a peak luminous intensity of at least about 3300 mcd, more preferably at least about 3700 mcd, and most preferably at least about 4000 mcd. In another example, LED devices 10 and 110 can generate a peak luminous intensity of about 3635 mcd to about 4135 mcd, more preferably, about 3835 mcd to about 3935 mcd and, most preferably, about 3855 mcd to about 3915 mcd. In a particularly preferred embodiment, LEDs 30 and 130 generate a peak luminous intensity of about 3885 mcd at a wavelength of about 619 nm to about 624 nm and centered at about 621 nm.

LED devices 10 and 110 are configured to produce a first viewing angle in a first direction of less than about 99° and a second viewing angle in a second direction of less than about 50°. In FIG. 1, the first direction is along first axis 40 and the second direction is along a second axis 50, in FIG. 4, the first direction is along first axis 140 and the second direction is along a second axis 150. Preferably, the first viewing angle is less than 95°, more preferably, less than 93°, most preferably, less than about 90°. Preferably, the second viewing angle is less than about 45°, more preferably, less than 40°, most preferably, less than about 35°.

In other embodiments, preferably, the first viewing angle may be about 63° to about 99°. More preferably, the first viewing angle is about 75° to about 93°. Most preferably, the first viewing angle is about 80° to about 90°. In these embodiments, preferably, the second viewing angle is about 35° to about 50°, more preferably, about 38° to about 48°, most preferably, about 40° to about 46°.

For example, LED 30 is mounted at the center of the round bottom surface 22, LED device 10 has a first viewing angle in the first direction of less than about 99° and a second viewing angle in the second direction of less than about a half of the first viewing angle. Similarly, LED device 110 has a first viewing angle in the first direction of less than about 97° and a second viewing angle in the second direction of less than about a half of the first viewing angle.

Figure 7:
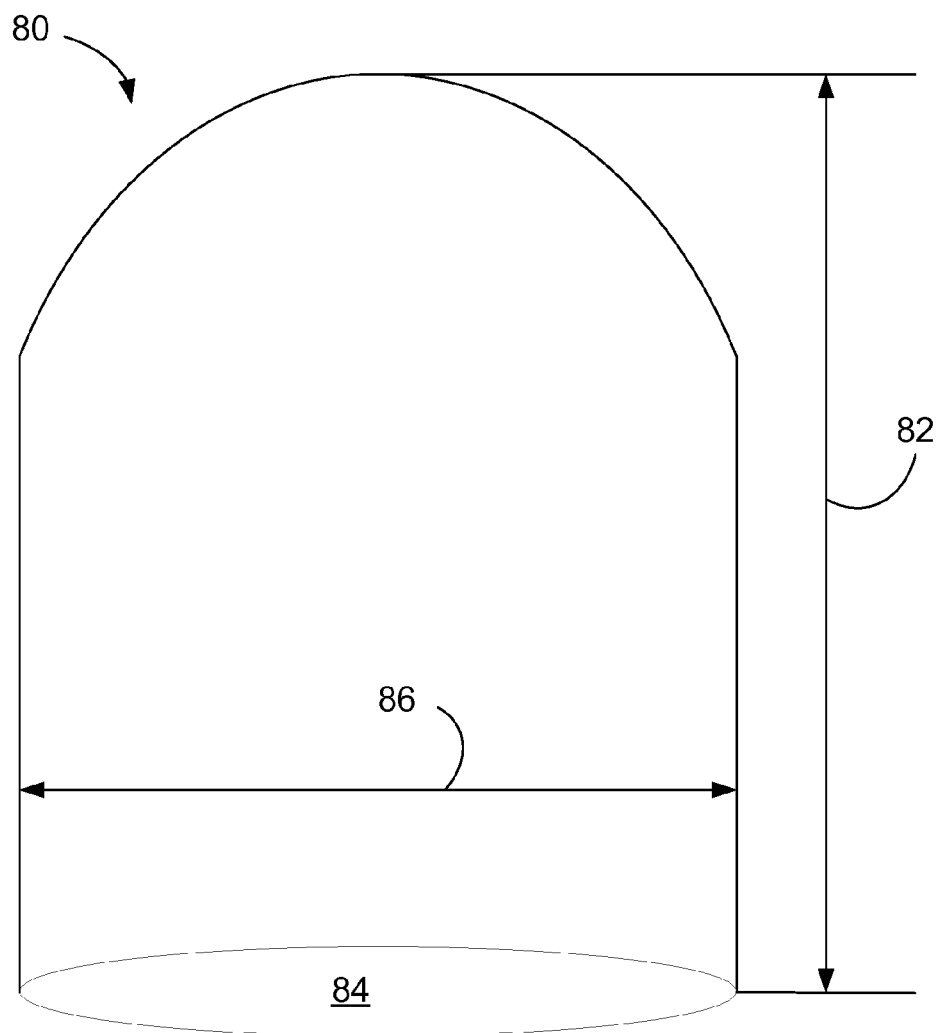
FIG. 7 is an elevation view of a lens used with an LED device in accordance with the disclosure.

FIG. 7 illustrates a lens 80 that may be used with the LED devices disclosed herein. Lens 80 has an oval bottom opening 84 and a dome-shaped upper surface 88. Further, lens 80 has a profile height 82 and a profile width 86. In some embodiments, preferably, profile height 82 is at least about 5.3 mm, more preferably at least about 5.8 mm, most preferably at least about 6.3 mm. In other embodiments, preferably, profile height 82 is about 5.3 mm to about 6.3 mm, more preferably about 5.5 mm to about 6.1 mm and, most preferably, about 6.3 mm.

Figure 8:
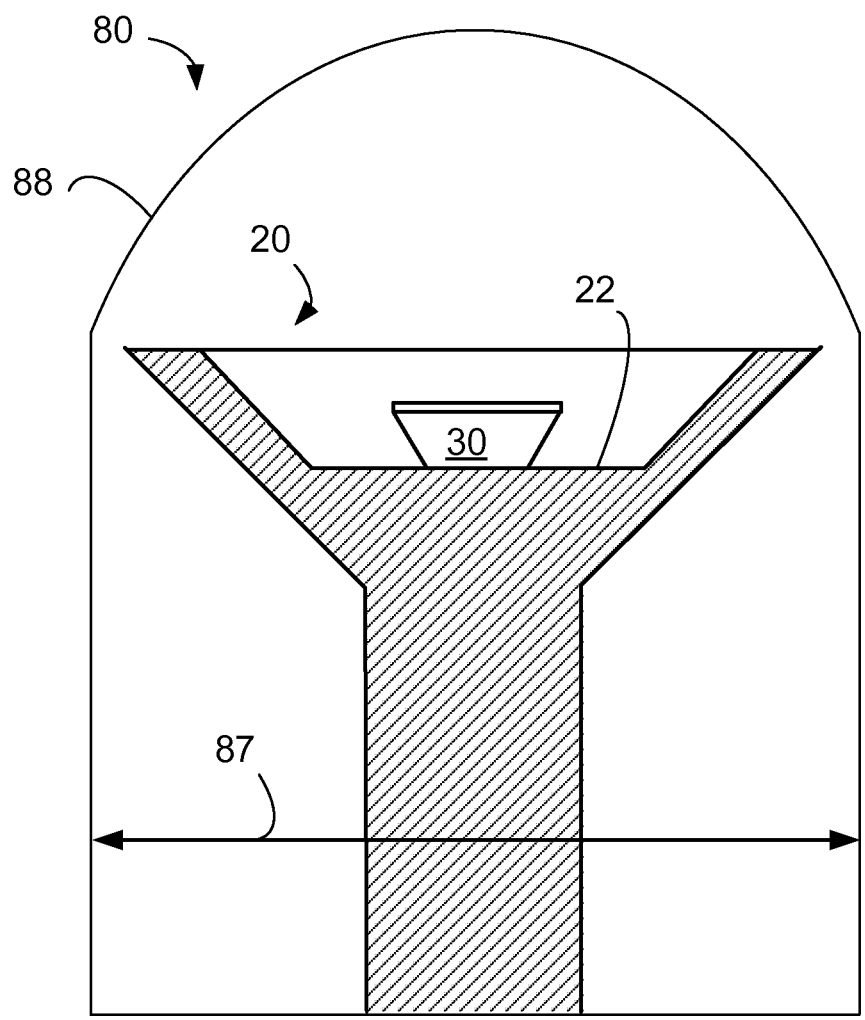
FIG. 8 is a second side view of the lens in FIG. 7 covering the LED device.
Figure 9:
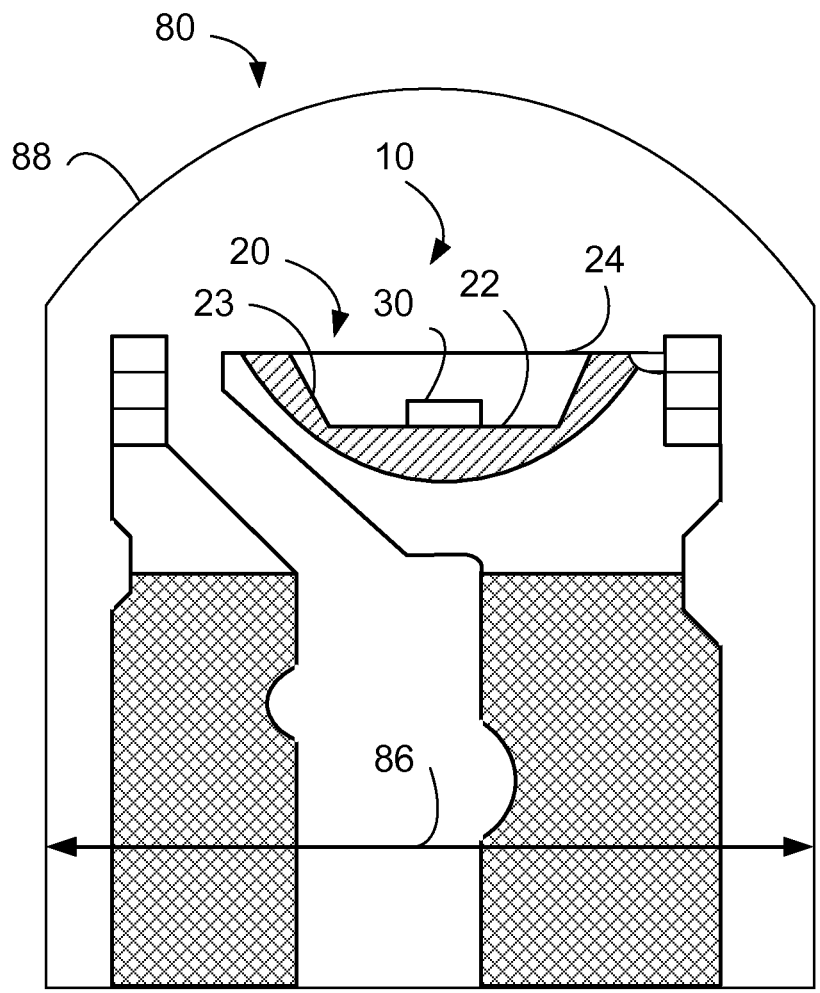
FIG. 9 is a second side view of the lens in FIG. 7 covering the LED device.
Figure 10:
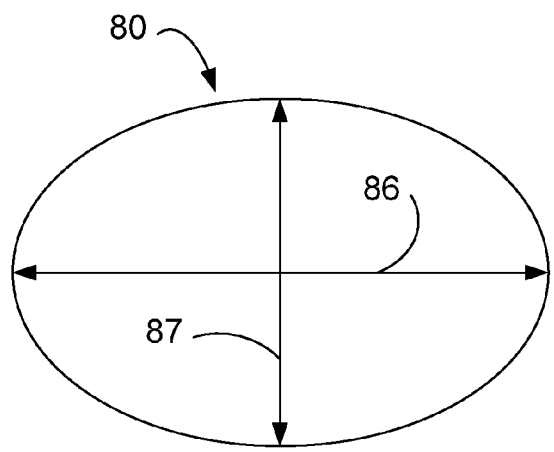
FIG. 10 is a top view of the lens in FIG. 7.

With reference to FIGS. 8-10, lens 80 at least partially covers reflector cup 20 and LED 30. Lens 80 has an oval-shaped cross-section having a first dimension 86 and a second dimension 87. First dimension 86 is preferably longer than second dimension 87. In some embodiments, preferably, first dimension 86 is less than about 4.4 mm, more preferably, less than about 4.2 mm and, most preferably, less than about 3.9 mm. Second dimension 87 is less than about 3.5 mm, more preferably, less than about 3.3 mm, and most preferably less than about 3.0 mm. In other embodiments, first dimension 86 is about 3.4 mm to about 4.4 mm, more preferably, about 3.6 mm to about 4.2 mm, and most preferably about 3.9 mm. Second dimension 87 is about 2.5 mm to about 3.5 mm, more preferably, about 2.7 mm to about 3.3 mm, and most preferably, about 3.0 mm.

Figure 11:
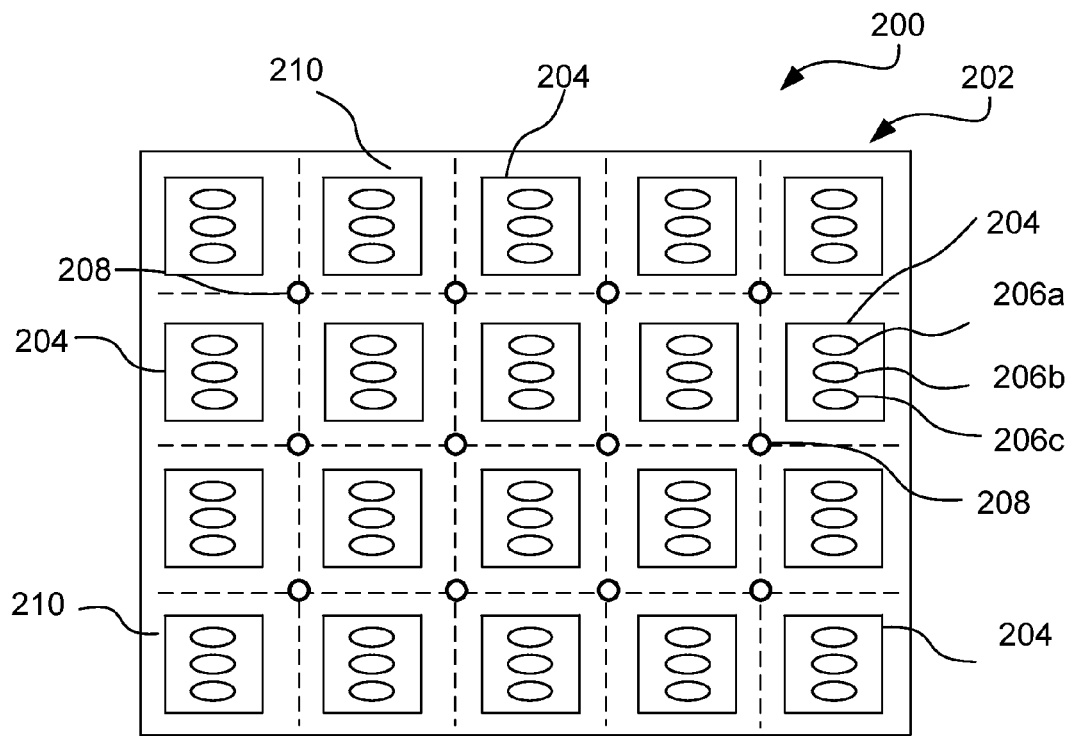
FIG. 11 is a plan view of a portion of an LED display screen incorporating LED devices in accordance with embodiments of the disclosure.

FIG. 11 is a plan view of a portion of an LED display screen 200, for example, a display screen including a driver PCB 202 carrying a large number of LED modules 204 arranged in rows and columns. Display screen 200 is divided into a plurality of pixels 210, each having an LED module 204 and each LED module includes a substrate carrying a plurality of LED devices 206. There may be a plurality of LED modules 204 in a pixel 210. Each pixel 210 of the display may have a size about 10 mm by about 10 mm or larger. Each LED module may be driven by different voltage levels. LED modules 204 include LED devices such as those described above and illustrated in FIGS. 1-10. The LED modules are electrically connected to metal traces or pads (not shown) on PCB 202 that connected the LEDs to appropriate electrical signal processing and driver circuitry (not shown). The signal processing and LED drive circuitry electrically are connected to selectively energize LED devices 206 in LED modules 204 for producing visual images on the display. There may be holes 208 between pixels 210 used to anchor the PCB 202 to mounting platforms.

In one embodiment, preferably, LED display screen 200 may generate a luminance of at least about 5000 nit, more preferably, at least about 10000 nit, most preferably, at least about 15000 nit. Specifically, LED display 200 may generate a luminance of at least about 20000 nit, more specifically, at least about 24000 nit at a working current less than about 20 mA. In another embodiment, LED display screen 200 may generate a peak luminance larger than about 16000 nit at a working current less than about 20 mA. Preferably, LED 200 may have a pixel pitch less than about 44 mm, more preferably, less than about 35 mm, most preferably, less than about 30 mm. Specifically, LED 200 may have a pixel pitch less than about 25 mm, more specifically, less than about 20 mm. For example, LED display screen 200 may generate a peak luminance of about 24375 nit at a working current at about 20 mA and a pixel pitch about 20 mm. For a normal outdoor LED screen with a luminance of about 5000 nit and a pixel pitch about 20 mm, the working current for each LED device in LED display screen 200 is less than about 6.2 mA. LED display screen 200 saves about 40% or more power compared to other LED displays using normal LED devices.

Those skilled in the art will recognize that the working current will vary depending upon the wavelength of light emitted by the display. Preferably, the working current for device emitting green light is less than about 6.1 mA and, more preferably, less than about 5.1 mA. In a particularly preferred embodiment, the working current for device emitting green light is about 4.1 mA. Preferably, the working current for device emitting blue light is less than about 4.7 mA, and more preferably, less than about 3.7 mA. In a particularly preferred embodiment, the working current for device emitting red light is about 2.7 mA. Preferably, the working current for device emitting red is less than about 5.1 mA and, more preferably, less than about 4.1 mA. In a particularly preferred embodiment, the working current for device emitting red light is about 3.1 mA.

For the normal outdoor LED screen with a luminance of about 5000 nit and a pixel pitch about 20 mm, the required peak lamp luminous intensity is about 2000 mcd. The corresponding working voltage is about 1.81V for device emitting red light, less than about 2.6V for device emitting green light, less than about 2.44V for device emitting blue light. The corresponding lamp power efficiency is about 152 lm/W for device emitting red light, about 161 lm/W for device emitting green light, and about 33 lm/W for device emitting blue light.

LED display screen 200 may consume much less power compared with other LED display screens. Preferably, the power consumption for a 1 m*1 m screen is less than about 30 W for red light, less than about 40 W for green light, and less than about 20 W for blue light. More preferably, the power consumption for a 1 m*1 m screen is less than about 25 W for red light, less than about 30 W for green light, and less than about 18 W for blue light. Most preferably, the power consumption for a 1 m*1 m screen is less than about 14.0 W for device red light, less than about 26.6 W for green light, and less than about 16.8 W for blue light. Preferably, the total power consumption for a 1 m*1 m screen is less than about 90 W. More preferably, the total power consumption for a 1 m*1 m screen is less than about 73 W, and most preferably, less than about 57.4 W.

LED module 204 includes at least one LED device 206 having an oval-shaped reflector cup disclosed above. For example, LED module 204 includes a first and second LED device 206a and 206b that emit different colored light. First and second LED device 206a and 206b preferably have matched far field pattern (FFP) in a first and second direction. In one embodiment, first and second LED devices 206a and 206b, have a first viewing angle in the first direction is less than about 99° and a second viewing angle in the second direction is less than about 50°. More preferably, the first viewing angle in the first direction is less than about 90° and the second viewing angle in the second direction is less than about 45°, and most preferably, the first viewing angle in the first direction is less than about 85° and the second viewing angle in the second direction is less than about 40°. Each LED module 204 further includes a third LED device 206c that emits a color different than that of the first and second LED devices. In some embodiments, third LED device 206c may have same viewing angles as the first and second viewing angle. In other embodiments, third LED device 206c may have smaller viewing angles than the first and second viewing angle of the first and second LED device 206a and 206b. Preferably, for third LED device 206c, a first viewing angle in the first direction is less than about 93° and a second viewing angle in the second direction is less than about 48°. More preferably, the first viewing angle in the first direction is less than about 88° and the second viewing angle in the second direction is less than about 43°. Most preferably, the first viewing angle in the first direction is less than about 83° and the second viewing angle in the second direction is less than about 38°. In one embodiment, first LED device 206a emits green light, second LED device 206b emits blue light, and third LED device 206c emits red light.

Preferably, first LED device 206a generates a peak luminous intensity of about 1200 mcd at a working current less than about 6.1 mA, second LED device 206b generates a peak luminous intensity of about 200 mcd at a working current less than about 4.7 mA, third LED device 206c generates a peak luminous intensity of about 600 mcd at a working current less than about 5.1 mA. More preferably, first LED device 206a generates a peak luminous intensity of about 1200 mcd at a working current less than about 5.1 mA, second LED device 206b generates a peak luminous intensity of about 200 mcd at a working current less than about 3.7 mA, third LED device 206c generates a peak luminous intensity of about 600 mcd at a working current less than about 4.1 mA. Most preferably, first LED device 206a generates a peak luminous intensity of about 1200 mcd at a working current less than about 4.1 mA, second LED device 206b generates a peak luminous intensity of about 200 mcd at a working current less than about 2.7 mA, third LED device 206c generates a peak luminous intensity of about 600 mcd at a working current less than about 3.1 mA.

In one embodiment, a corresponding LED display consumes less than about 60 W per m², for example, about 57.4 W per m². Preferably, the LED display consumes less than about 20 W per m² to generate each color of red, green, and blue. For example, the LED display consumes less than about 14.0 W per m² on to generate red light, the LED display consumes less than about 26.6 W per m² on to generate green light, the LED display consumes less than about 16.8 W per m² on to generate blue light. In one embodiment, the LED display generates a luminance at about 24375 nit with the pixel pitch at about 20 mm at a working current about 20 mA.

Those skilled in the art will recognize that the LED devices may be organized differently in LED module 204 and still achieve the advantages of the LED devices disclosed herein.

Figure 12A:
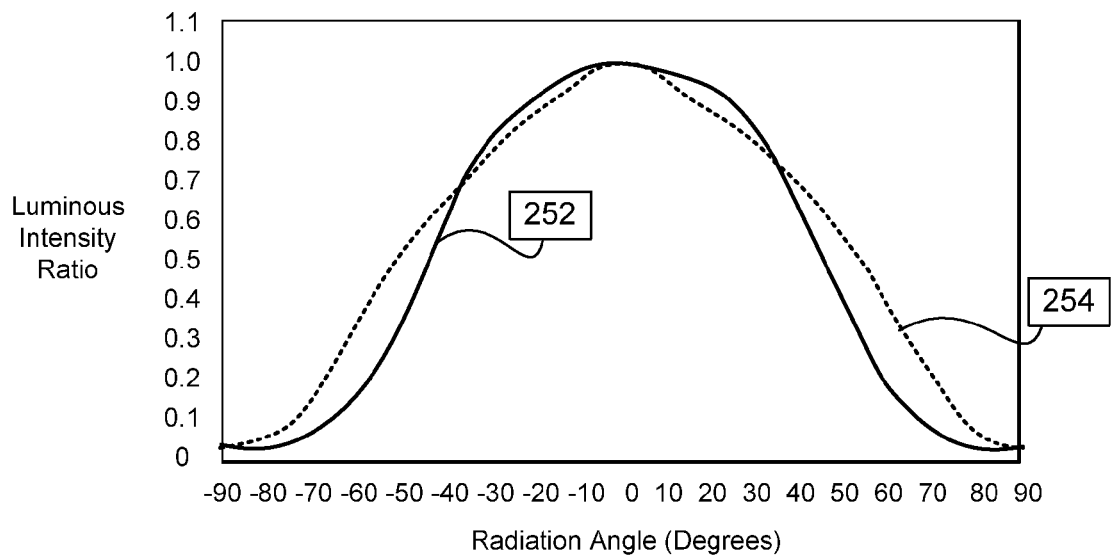
FIG. 12(a) is a plot illustrating a horizontal far field pattern of an LED device according to one embodiment of the disclosure.
Figure 12B:
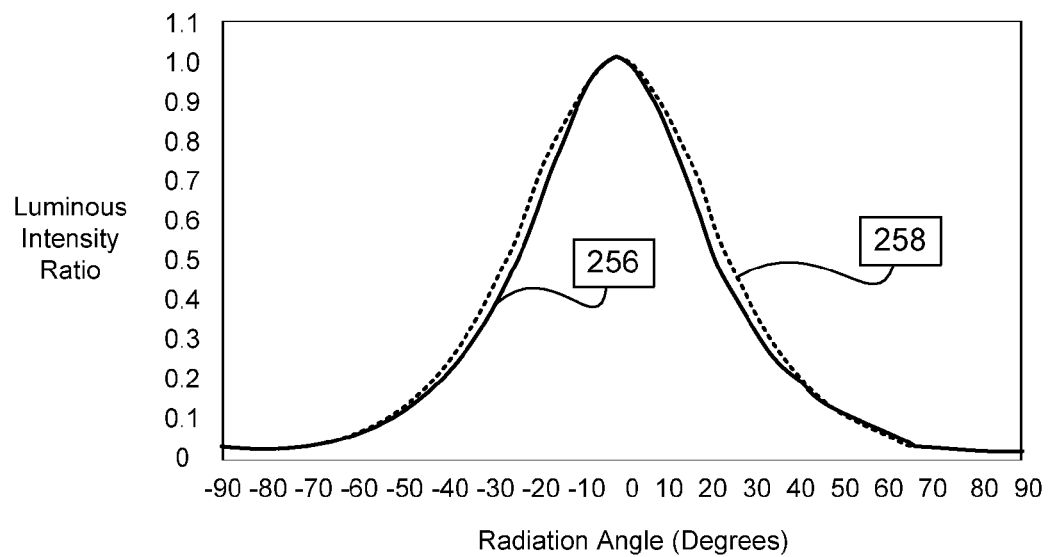
FIG. 12(b) is a plot illustrating a vertical far field pattern of an LED device according to one embodiment of the disclosure.

FIG. 12(a) illustrates comparative horizontal FFPs of an LED device according to the disclosure 252 and an LED device of prior art 254. As noted, horizontal FFP 252 of the disclosed LED device is smoother than horizontal FFP 254 of an LED device according to the prior art. FIG. 12(b) illustrates comparative vertical FFPs of the disclosed LED device 256 and an LED device of prior art 258. As noted, vertical FFP 256 of the disclosed LED device is smoother than vertical FFP 258 of the prior art LED device. Accordingly, the 2D FFP of the LED device has an ellipse shape having a first axial dimension and a second axial dimension. The first dimension represents horizontal FFP and the second dimension represents vertical FFP.

Figure 13A:
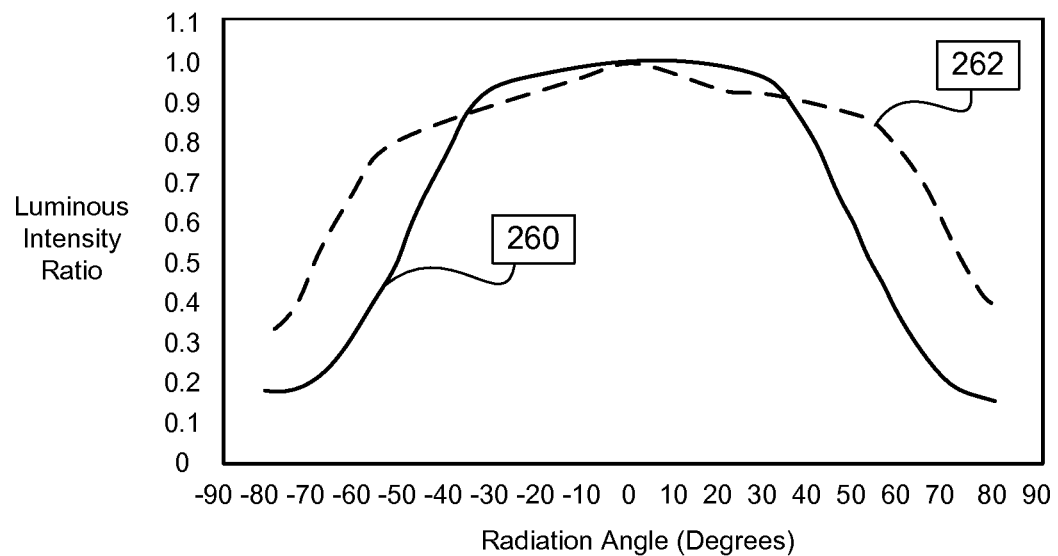
FIG. 13(a) is a plot illustrating a horizontal screen curve of an LED device according to one embodiment of the disclosure.
Figure 13B:
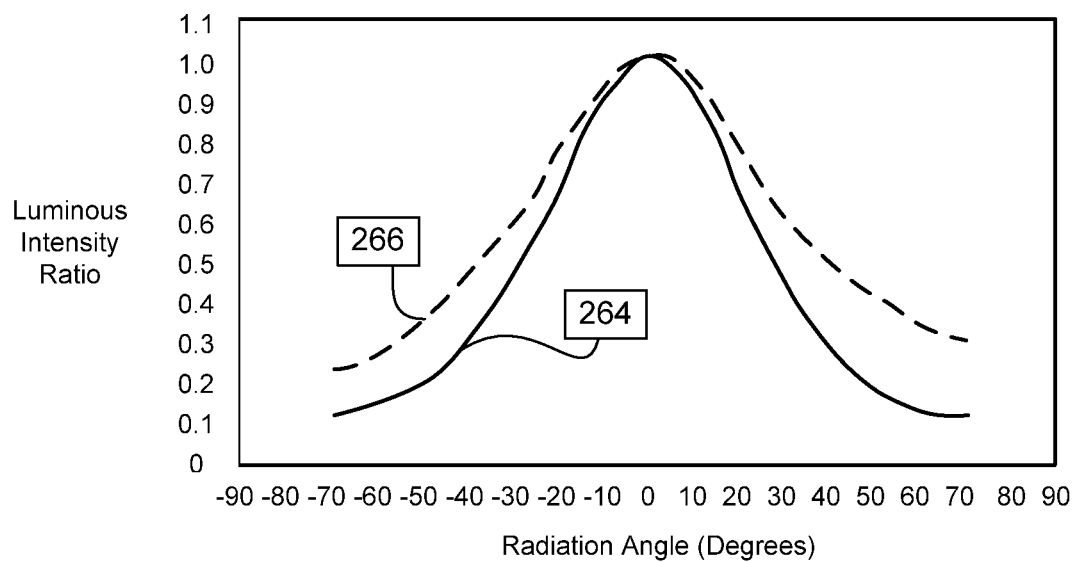
FIG. 13(b) is a plot illustrating a vertical screen curve of an LED device according to one embodiment of the disclosure.

The screen curve is an optical characteristic of a display screen that illustrates a normalized luminous intensity ratio at different radiation angles. Screen curves need to be matched closely for different colors of LED display 200. FIG. 13(a) illustrates the horizontal screen curves of LED display 200 and an LED display of prior art. FIG. 13(b) illustrates the vertical screen curve of LED display 200 and an LED display of prior art. Significantly, horizontal screen curve 260 of the disclosed LED display is smoother than horizontal screen curve 262 of LED display of the prior art. FIG. 13(b) illustrates the vertical screen curves of the disclosed LED display and an LED display of prior art. Vertical screen curve 264 of the disclosed LED display is smoother than vertical screen curve 266 of the prior art LED display.

In some embodiments, LED display 200 has a horizontal viewing angle $\theta_1$ that is less than about 110° and a vertical viewing angle $\theta_2$ that is less than about 60°. More preferably, LED display 200 has a horizontal viewing angle $\theta_1$ less than about 106° and a vertical viewing angle $\theta_2$ less than about 56°. Most preferably, LED display 200 has a horizontal viewing angle $\theta_1$ less than about 100° and a vertical viewing angle $\theta_2$ less than about 50°. In other embodiments, LED display 200 may have a horizontal viewing angle $\theta_1$ of about 90° to about 110° and a vertical viewing angle $\theta_2$ of about 40° to about 60°. More preferably, LED display 200 has a horizontal viewing angle $\theta_1$ of about 95° to about 106° and a vertical viewing angle $\theta_2$ of about 45° to about 56°. Most preferably, LED display 200 has a horizontal viewing angle $\theta_1$ of about 100° and a vertical viewing angle $\theta_2$ of about 50°.

Figure 14:
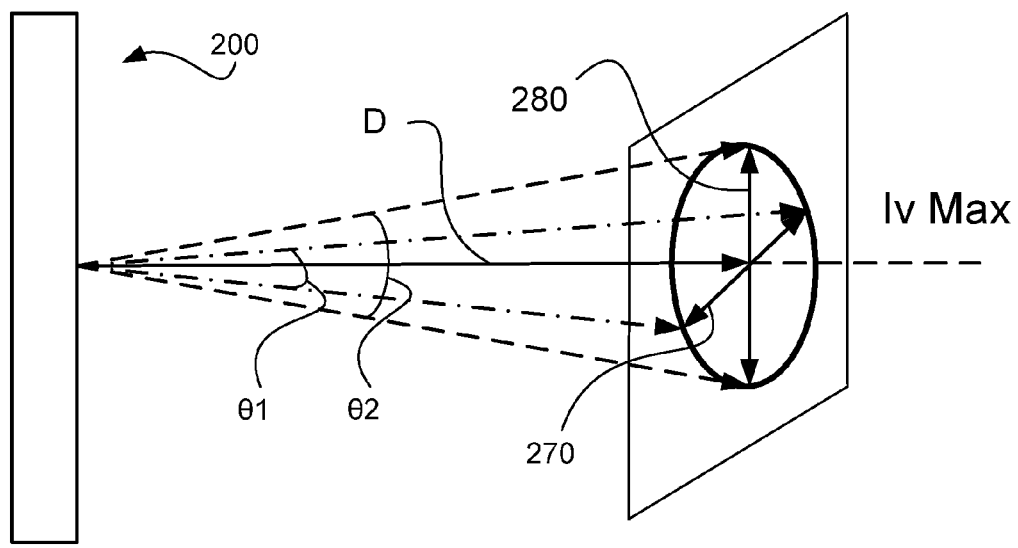
FIG. 14 is a schematic diagram illustrating a display producing a 2D far field pattern according to one embodiment of the disclosure.

FIG. 14 is a schematic diagram illustrating a two dimensional "2D" FFP according to one embodiment of the disclosure produced by LED display 200. The 2D FFP has an elliptical shape. The elliptical shape has a first dimension 270 in a first direction and a second dimension 280 in a second direction, where the first direction is substantially orthogonal to the second direction. In one embodiment, the 2D FFP can be characterized at a distance "D" between LED display 200 and a viewing position for a given LED device viewing angle, At distance D from display 200, first dimension 270 is expressed by the relationship $2D \times \tan(\theta_1/2)$ and second dimension 280 is expressed by the relationship $2D \times \tan(\theta_2/2)$, where $\theta_1$ are the horizontal and vertical viewing angles the display. The distance D is measured along a center radian that represents the maximum luminous intensity ($Iv_{max}$) of the display. The luminous intensity of LED display 200 or the screen curve, as described above, is related to luminous intensity the LED devices by the expression, $Iv_{display} = Iv_{LED}/\cos(\theta)$, where $\theta$ is the viewing angle of the display.

In accordance with the LED device embodiments described above, as the viewing angles of the LED devices decreases and the corresponding viewing angles of the display decrease, first and second dimensions 270 and 280 will correspondingly decrease. For example, where D is about 50 m, in one embodiment, first dimension 270 is less than about 143 m, more preferably less than about 133 m and, most preferably, less than about 119 m. Correspondingly, in one embodiment, second dimension 280 is less than about 58 m, more preferably less than about 53 m and, most preferably, less than about 47 m. Accordingly, at distance D, the area of the 2D FFP ellipse illustrated in FIG. 14 is preferably less than about 6626 m², more preferably, less than about 5536 m² and, most preferably, less than about 4393 m².

In accordance with a particular embodiment of the disclosure, for example, where D is about 50 m and the horizontal viewing angle of the LED devices is less than about 90° and the vertical viewing angle is less than about 45°, and the corresponding display viewing angles are less than about 106° and less than about 53°, first dimension 270 corresponds to a horizontal viewing angle of LED display 200 that is less than about 133 m and a vertical viewing angle that is less than about 53 mm.

From the foregoing, it can be seen that the present embodiments provide an LED device that includes an oval-shaped reflector cup having a bottom surface and a wall surface inclined relative to the bottom surface and defining an opening at an upper end thereof. An LED mounted on the bottom surface may be at least partially covered by a lens. In accordance with a feature of the disclosed LED device, the light emitted from the LED device is tilted towards the eyes of a viewer. Further, large displays screens incorporated the disclosed LED devices exhibit a reduced amount of wasted light.

It is therefore intended that the foregoing detailed description be regarded as illustrative rather than limiting, and that it be understood that it is the following claims, including all equivalents, that are intended to define the spirit and scope of this disclosure.

We claim:

1. A light emitting diode (LED) device comprising:
a lead frame having a reflector cup therein, the reflector cup having a round bottom surface and a wall surface having a variable inclination angle with respect to the bottom surface and defining an opening at an upper end thereof; and
an LED mounted on the bottom surface,
wherein the reflector cup has a depth from the upper end of the wall surface to the bottom surface larger than about 0.25 mm; and
wherein the variable inclination angle between the wall surface and the round bottom surface varies at different points around a perimeter of the round bottom surface.

2. The LED device of claim 1, wherein the round bottom surface has a diameter of less than about 0.7 mm.

3. The LED device of claim 2, wherein the depth is about 0.25 mm to about 0.40 mm.

4. The LED device of claim 1, wherein the LED device has a horizontal viewing angle that is larger than a vertical viewing angle.

5. The LED device of claim 4, wherein the opening has an oval geometrical shape that has a first dimension along a first axis of about 0.8 mm to about 0.9 mm and a second dimension of about 0.7 mm to about 0.8 mm along a second axis orthogonal to the first axis.

6. The LED device of claim 5, wherein the LED emits green or blue light.

7. The LED device of claim 4, wherein the opening has a round geometrical shape and has a diameter about 0.9 mm to about 1.1 mm.

8. The LED device of claim 7, wherein the LED emits red light.

9. The LED device of claim 7, wherein the horizontal viewing angle is between about 62° to about 98°, and the vertical viewing angle is between about 34° to about 49°.

10. The LED device of claim 1, wherein the opening has an oval geometrical shape and the wall surface defines a first opening angle about 40° to about 60° and a second opening angle substantially orthogonal to the first opening angle of about 20° to about 40°.

11. The LED device of claim 10, wherein the first opening angle is about 45° to about 55° and the second opening angle is about 25° to about 35°.

12. The LED device of claim 1, wherein the opening has a round geometrical shape and the wall surface has a vertical portion joined to the bottom surface and separating the bottom surface from an inclined portion and wherein the inclined portion defines an opening angle about 50° to about 70°.

13. The LED device of claim 1, further comprising a symmetrical lens that completely covers the lead frame, wherein the lens has a lens depth greater than the depth of the reflective cup.

14. The LED device of claim 13, wherein the lens has an oval cross-section that has a first dimension along a first axis and a second dimension along a second axis, the first dimension is longer the second dimension.

15. The LED device of claim 14, wherein the first dimension is less than about 4.4 mm and the second dimension is less than about 3.5 mm.

16. The LED device of claim 13, wherein the symmetrical lens has a profile height of at least about 5.3 mm.

17. A light emitting diode (LED) device comprising:
a lead frame reflector cup having a round bottom surface and wall surface having a vertical portion relative to the bottom surface and joined to the bottom surface, the vertical portion separating the bottom surface from an inclined portion, wherein the inclined portion defines an opening at an upper end thereof; and
an LED mounted on the bottom surface.

18. The LED device of claim 17, wherein the lead frame reflector cup comprises iron and the inclined portion defines an opening angle about 50° to about 70°.

19. The LED device of claim 18, wherein a length of the vertical portion is less than a length of the inclined portion.

20. The LED device of claim 18, wherein the reflector cup has a depth from the upper end of the inclined portion to the bottom surface of about 0.25 mm to about 0.40 mm.

21. A LED module comprising:
a first and a second LED device that emit different colors, wherein the first and second LED devices have substantially matched far field patterns in a first and a second direction, and wherein a first viewing angle in the first direction is less than about 99°, and a second viewing angle in the second direction is less than about 50°, and
wherein at least one of the first and second LED devices comprises an lead frame having a reflector cup stamped therein; and
wherein the reflector cup comprises a round bottom surface and a wall surface having a variable inclination angle that varies at different points around a perimeter of the round bottom surface.

22. The LED module of claim 21 further comprising a third LED device that emits a color different than the color emitted by the first and second LED devices, wherein the third LED device has substantially the same first and second viewing angles as the first and second LED devices.

23. The LED module of claim 22, wherein the third LED device emits red light.

24. The LED module of claim 22, wherein the first LED device emits green light and generates a peak luminous intensity of at least about 5600 mcd.

25. The LED module of claim 22, wherein the second LED device emits blue light generates a peak luminous intensity of at least about 1205 mcd at a working current less than about 20 mA.

26. The LED module of claim 23, wherein the third LED device generates a peak luminous intensity of at least about 3300 mcd at a working current less than about 20 mA.

27. The LED module of claim 22, wherein the first LED device generates a peak luminous intensity of at least about 1200 mcd at a working current less than about 6.1 mA.

28. The LED module of claim 22, wherein the second LED device generates a peak luminous intensity of at least about 200 mcd at a working current less than about 4.7 mA.

29. The LED module of claim 22, wherein the third LED device generates a peak luminous intensity of at least about 600 mcd at a working current less than about 5.1 mA.

30. The LED module of claim 21, further comprising a third LED device that emits a color different than that of the first and second LED device, wherein the third LED device has smaller viewing angles than the first and second viewing angle of the first and second LED device.

31. The LED module of claim 30, wherein the first viewing angle in the first direction is less than about 95°, and a second viewing angle in the second direction is less than about 45°.

32. A light emitting diode (LED) device comprising:
a lead frame having a reflector cup therein, the reflector cup having a round bottom surface and a wall surface having a variable inclination angle with respect to the bottom surface and defining an opening at an upper end thereof; and
an LED mounted at a center of the round bottom surface, wherein the LED device has a first viewing angle in a first direction of less than about 99° and a second viewing angle in a second direction of less than about one half of the first viewing angle; and
wherein the variable inclination angle between the wall surface and the round bottom surface varies at different points around a perimeter of the round bottom surface.

33. The LED device according to claim 32, wherein the first viewing angle is less than about 95°.

34. The LED device according to claim 32, wherein the first viewing angle is about 75° to about 93°.

35. The LED device according to claim 32, wherein the LED device emits green light and generates a peak luminous intensity of at least about 5600 mcd.

36. The LED device according to claim 32, wherein the LED device emits blue light generates a peak luminous intensity of at least about 1205 mcd.

37. The LED device according to claim 32, wherein the LED device emits red light and generates a peak luminous intensity of at least about 3300 mcd.

38. A light emitting diode (LED) device comprising a lead frame having a reflector cup having a round bottom surface and a wall surface having a variable inclination angle with respect to the bottom surface and defining an opening at an upper end thereof; and an LED mounted at a center of the round bottom surface, wherein the variable inclination angle between the wall surface and the round bottom surface varies at different points around the perimeter of the round surface wherein the LED device is configured to produce a first viewing angle in a first direction and a second viewing angle in a second direction, and wherein the first and second viewing angles are less than about 50°, and the first direction is orthogonal to the second direction.

39. The LED device according to claim 38, wherein the first and second viewing angles are less than about 45°.

40. The LED device according to claim 38, wherein the first and second viewing angles are about 35° to about 50°.

41. The LED device according to claim 38, wherein the LED device emits green light and generates a peak luminous intensity of at least about 5600 mcd.

42. The LED device according to claim 38, wherein the LED device emits green light and generates a peak luminous intensity of at least about 5600 mcd at a working current less than about 20 mA.

43. The LED device according to claim 38, wherein the LED device emits blue light generates a peak luminous intensity of at least about 1205 mcd.

44. The LED device according to claim 38, wherein the LED device emits blue light and generates a peak luminous intensity of at least about 1205 mcd at a working current less than about 20 mA.

45. The LED device according to claim 38, wherein the LED device emits red light and generates a peak luminous intensity of at least about 3300 mcd at a working current less than about 20 mA.

46. The LED device according to claim 38, wherein the LED device emits red light and generates a peak luminous intensity of at least about 3300 mcd.

* * * * *